US006671816B1

(12) United States Patent
Woo

(10) Patent No.: US 6,671,816 B1
(45) Date of Patent: Dec. 30, 2003

(54) SYSTEM AND METHOD FOR INDEPENDENT POWER SEQUENCING OF INTEGRATED CIRCUITS

(75) Inventor: Agnes N. Woo, Encino, CA (US)

(73) Assignee: Broadcom Corporation, Irvine, CA (US)

(*) Notice: Subject to any disclaimer, the term of this patent is extended or adjusted under 35 U.S.C. 154(b) by 572 days.

(21) Appl. No.: 09/606,485

(22) Filed: Jun. 29, 2000

Related U.S. Application Data
(60) Provisional application No. 60/141,393, filed on Jun. 29, 1999.

(51) Int. Cl.[7] ............................................. G06F 1/26
(52) U.S. Cl. ..................................................... 713/330
(58) Field of Search ................................. 713/300, 330

(56) References Cited

U.S. PATENT DOCUMENTS

| | | | | |
|---|---|---|---|---|
| 4,151,425 A | | 4/1979 | Cappa ........................... 307/130 |
| 4,593,349 A | * | 6/1986 | Chase et al. .................. 713/330 |
| 4,674,031 A | * | 6/1987 | Siska, Jr. ....................... 700/79 |
| 5,180,965 A | | 1/1993 | Nose ............................ 323/275 |
| 5,560,022 A | * | 9/1996 | Dunstan et al. .............. 713/300 |
| 5,752,046 A | * | 5/1998 | Oprescu et al. .............. 713/300 |
| 6,237,103 B1 | * | 5/2001 | Lam et al. .................... 713/330 |
| 6,345,362 B1 | * | 2/2002 | Bertin et al. ................. 713/300 |

FOREIGN PATENT DOCUMENTS

| | | |
|---|---|---|
| EP | 0 505 158 | 9/1992 |
| EP | 0 663 727 | 7/1995 |

* cited by examiner

Primary Examiner—Thomas M. Heckler
(74) Attorney, Agent, or Firm—Sterne, Kessler, Goldstein & Fox, P.L.L.C.

(57) ABSTRACT

A circuit for applying power to mixed mode integrated circuits in a predefined sequence. The circuit includes a first circuit powered by a first voltage and a second circuit powered by a second voltage that is less than the first voltage and having the second voltage coupled to the first circuit. The circuit for applying power to mixed mode integrated circuits includes a modified I/O cell of the second circuit. The modified I/O cell has a driver transistor including a back gate terminal, a gate terminal that is driven by the second circuit, a drain terminal that is coupled to a first circuit signal, and a source terminal that is coupled to the second voltage. The circuit for applying power to mixed mode integrated circuits further includes a controller circuit coupled to the first voltage and the second voltage supplied as controller circuit inputs. The controller circuit has a plurality of controller circuit outputs. The circuit for applying power to mixed mode integrated circuits also includes a back gate bias application circuit. The back gate bias application circuit has a plurality of inputs coupled to the plurality of controller circuit outputs, and an output coupled to the back gate of the driver transistor back gate terminal.

16 Claims, 7 Drawing Sheets

SYSTEM AND METHOD FOR INDEPENDENT POWER SEQUENCING OF INTEGRATED CIRCUITS

CROSS REFERENCE TO RELATED APPLICATION

This application claims the benefit of Provisional Application No. 60/141,393 filed Jun. 29, 1999, the contents of which is hereby incorporated by reference.

BACKGROUND OF THE INVENTION

Power sequencing circuits play a key role in a number of applications which require a controlled application of power sources, such as computer systems, and the like. In an integrated circuit having interconnected circuitry that is powered by differing voltages, a power sequencing circuit might be used to control the application of power supply voltages to the various circuits in an orderly manner. In interconnected circuits that operate on differing voltages the circuit operating at the lower voltages tend to be the more susceptible to damage. Alternatively, power sequencing circuits are advantageously designed to protect circuits by utilizing a circuit configuration that avoids the turn on of parasitic circuit elements that tend to damage integrated circuitry.

Those having skill in the art will understand the desirability of having a power sequencing circuit that controls power supply application and tends to prevent the creation of parasitic current paths. This type of device would necessarily provide power supply sequencing and integrated circuit damage protection by providing a circuit to control the application of power supply voltages in an integrated circuit and is coupled to the integrated circuit such that parasitic current paths tend to be eliminated, thus allowing an integrated circuit comprising individual circuits operating from differing voltages to be produced.

SUMMARY OF THE INVENTION

There is therefore provided in a present embodiment of the invention a circuit for applying power to mixed mode integrated circuits in a predefined sequence to a first circuit powered by a first voltage and a second circuit powered by a second voltage that is less than the first voltage and having the second voltage coupled to the first circuit. The circuit for applying power to mixed mode integrated circuits includes, a modified I/O cell of the second circuit. The modified I/O cell has a driver transistor including a back gate terminal, a gate terminal that is driven by the second circuit, a drain terminal that is coupled to a first circuit signal, and a source terminal that is coupled to the second voltage.

The circuit for applying power to mixed mode integrated circuits further includes a controller circuit coupled to the first voltage and the second voltage supplied as controller circuit inputs. The controller circuit has a plurality of controller circuit outputs.

The circuit for applying power to mixed mode integrated circuits also includes a back gate bias application circuit. The back gate bias application circuit has a plurality of inputs coupled to the plurality of controller circuit outputs, and an output coupled to the back gate of the driver transistor back gate terminal.

Many of the attendant features of this invention will be more readily appreciated as the same becomes better understood by reference to the following detailed description considered in connection with the accompanying drawings.

DESCRIPTION OF THE DRAWINGS

These and other features and advantages of the present invention will be better understood from the following detailed description read in light of the accompanying drawings, wherein:

FIG 1 is a schematic diagram illustrating parasitic current flow from high voltage power supply $V_{HIGH}$ to a lower voltage power supply $V_{LOW}$ at power supply turn on;

Like reference numerals are used to designate like parts in the accompanying drawings.

DETAILED DESCRIPTION OF THE INVENTION

Figure 1:
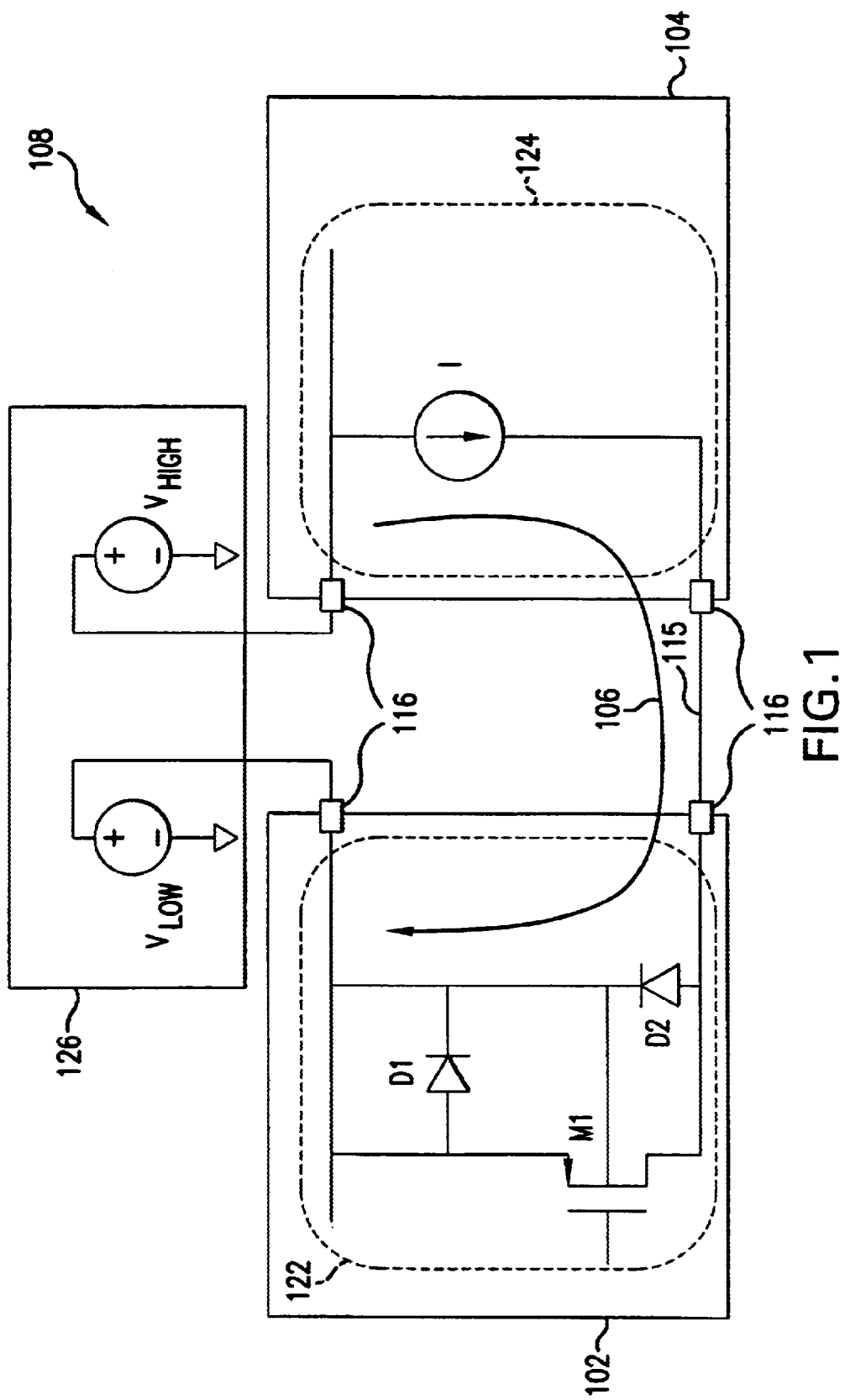

FIG. 1 is a schematic diagram illustrating possible parasitic current flow from higher voltage power supply $V_{HIGH}$ to a lower voltage power supply $V_{LOW}$ at power supply turn on. A trend in integrated circuit design is to operate integrated circuits at lower power supply voltages. Low voltage power supply operation is desirable to reduce power dissipation and to allow fast circuit technologies to operate without breakdown voltage problems. If power supplies of differing voltages are present in a circuit, these power supplies do not reach their final value of voltage at the same time when they are activated. Also, if circuits 102, 104 operate from different power supply voltages $V_{LOW}$ $V_{HIGH}$, the components within the circuit tend not to rise to their final operating voltage at the same time tending to cause an undesired current flow 106.

One or more low voltage integrated circuits ("ICs"), such as low voltage integrated circuit 102 operates from one or more low voltage power supplies such as $V_{LOW}$. One or more high voltage integrated circuits, such as high voltage integrated circuit 104 that operates from one or more higher voltage power supplies such as power supply voltage $V_{HIGH}$. The one or more high voltage power supplies are at a higher potential than $V_{LOW}$. The two integrated circuits 102, 104 include individual substrates 122, 124 and operate in conjunction with each other in a common functional environment 108, such as a common semiconductor substrate, printed circuit board, ceramic hybrid substrate, or the like to provide an overall desired circuit function.

The two circuits, and thus the power supplies $V_{HIGH}$ and $V_{LOW}$, are typically coupled electrically by one or more interfacial connections such as shown at 115. Often circuits that operate from different potentials are present to achieve a given overall desired circuit function. It is sometimes desirable to mix the circuits operating from different power supplies if lower power consumption can be achieved by utilizing one or more available circuits that operate from lower power supply voltages. A situation where this would arise is in the use of pre-designed intellectual property ("IP") cores, where because of time or budget constraints it is desirable to use the circuit as it was designed, without modifying it to operate from a common power supply voltage.

Interfacial connections are typically achieved in integrated circuits through one or more pads 116. The pads are typically coupled to a pin or lead of an integrated circuit package, or to a chip carrier, via a wire bond. Current flow path 106 to the lower voltage power supply from the high voltage power supply is typically through one or more parasitic diodes, such as D2, present in a transistor M1. The parasitic diodes tend to be inherent to the internal circuitry of an integrated circuit ("IC") 102 operating from the lower supply voltage $V_{LOW}$. A common path for current flow to the lower voltage power supply is through interface circuitry Ml present at an integrated circuit pin. For example, in digital circuitry interfacial circuitry of this type is often utilized to mix different logic families such as TTL, LS and CMOS. Additionally, digital circuitry often incorporates open collector transistor outputs into the designs as interfacial circuitry to provide sufficient and adjustable drive levels to circuitry coupled to these outputs.

Current flow 106 from the higher voltage power supply $V_{HIGH}$ to the lower voltage power supply $V_{LOW}$ typically occurs on power up through a transistor M1 in an integrated circuit 102 that is coupled to a circuit 104 operating from a bias voltage higher than that of the transistor. The individual integrated circuits are often disposed on a common substrate. The difference in turn on times of the different power supplies $V_{HIGH}$, $V_{LOW}$, or the differences in time that it takes for various components in a given integrated circuit to migrate or float up to a final voltage is often enough to turn on a parasitic or ESD device inherent to the circuit operating from the lower power supply voltage.

In summary, circuit 102 is operated from the lower voltage supply $V_{LOW}$ and can be damaged by parasitic or ESD device turn-on caused by coupling to the circuit 104 that is operated from the higher supply voltage $V_{HIGH}$. The connection 115 coupling the two circuits provides a low impedance path between the higher voltage power supply and the lower voltage power supply through a parasitic device. A current path 106, through a parasitic diode, such as D2, that couples supply $V_{LOW}$ and $V_{HIGH}$ is established. It is desirable to modify the connections to driver or interfacial transistors, such as M1 in the low voltage integrated circuit 102 to eliminate the current path 106.

Figure 2:
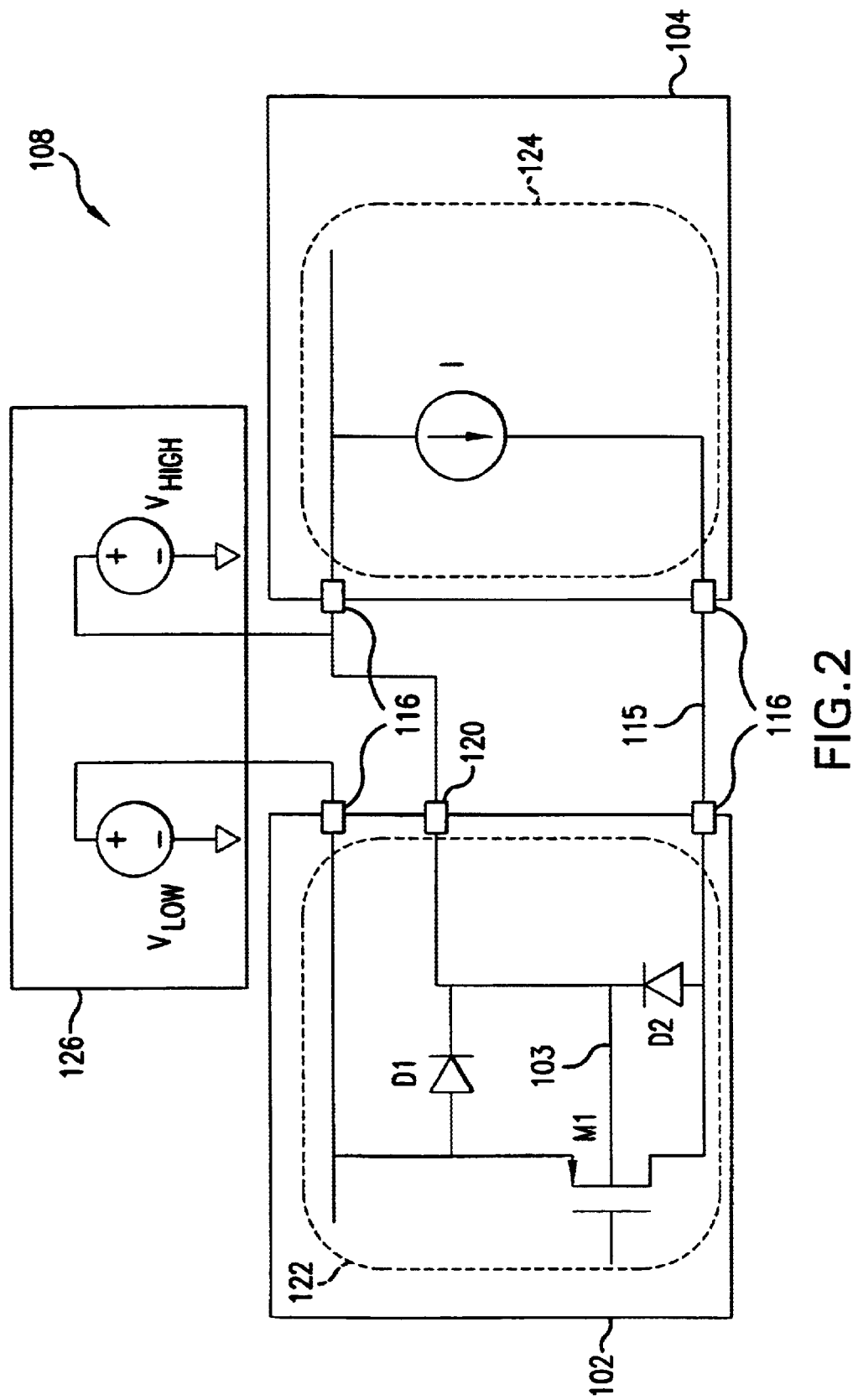
FIG 2 is a schematic of an embodiment of a circuit that prevents the turn-on of the parasitic diode present in the transistor by an incoming signal having a higher voltage level.

FIG. 2 is a schematic of an embodiment of a circuit that prevents the turn-on of the parasitic diode present in the transistor by an incoming signal from a circuit operating at a higher voltage level. The technique requires that a connection to the higher voltage 120 is available on the integrated circuit 102. The higher voltage $V_{HIGH}$ is tied to a back gate 103 of one or more of the interfacial driver transistors M1 that tend to be prone to parasitic turn on.

A back gate connection refers to a gate connection that includes the entire substrate of the integrated circuit. When a back gate has a higher potential, parasitic diodes D1 and D2 do not turn on, preventing a large current flow, that would otherwise tend to damage the ICs. In a typical integrated circuit a gate contact is disposed as a metalized pattern on the surface of an IC directly above a channel region of a field effect transistor. Typically, there is an insulating layer between the gate contact and the channel region. A back gate connection consists of adding a contact to the substrate of the integrated circuit, that is on the opposite side of the integrated circuit from the gate contact.

The coupling of a back gate contact to the substrate is established through to an upper surface of the wafer upon which the circuit is disposed. The back gate contact is coupled to the polysilicon substrate through a diffusion window disposed in the integrated circuit.

In using the described circuit, the higher voltage power supply is properly applied before the lower voltage power supply is applied. If the power is not sequenced from highest voltage to lowest voltage, the circuit in which the embodiment of the protection circuit is applied tends to be prone to damage. The application sequence described, and circuitry to implement it, may tend to be undesirable for some circuit applications. It is desirable to utilize the circuit shown in FIG. 2 and additional circuitry that will allow the power supplies to be properly sequenced on without regard to the order of application of the power supplies.

One or more integrated circuit IP cores 102 are powered by one or more low bias voltages, such as $V_{LOW}$. The low bias voltages are less than one or more high bias voltages, such as $V_{HIGH}$. The low bias voltages are coupled to one or more low voltage integrated circuit IP cores 102, present on the integrated circuit 108. The high bias voltages are coupled to one or more high voltage integrated circuit IP cores 104 present on the integrated circuit 108. Coupling of a bias voltage to an IP core may be through a pad, pin or other equivalent connection.

Although the embodiments of the invention are presented in the context of integrated circuits, it will be appreciated by those skilled in the art that the invention also applies to technologies such as individual packaged integrated circuits that are disposed on one or more printed wiring boards that require differing supply voltages. Equivalently the invention may also be applied to circuitry biased by differing power supplies that require power sequencing to function properly, whether the circuitry is disposed on an integrated circuit, printed circuit board or the like. Bias voltages $V_{HIGH}$ and $V_{LOW}$ are shown as being supplied externally. Equivalently, either $V_{HIGH}$ and/or $V_{LOW}$ may be generated on the integrated circuit from one or more voltages available locally.

Circuit 102 is shown as having an I/O cell or interfacial circuit 122. Integrated circuits typically interface circuitry 122 at each I/O connection 116. The I/O cell is connected to external voltages $V_{LOW}$, $V_{HIGH}$ and to one or more external signal connections, such as shown at 115. The external signal typically originates from another circuit 104 that is operating at the same or higher voltage. Voltages $V_{LOW}$ and $V_{HIGH}$ are supplied as supply voltage rails within the I/O cell.

As shown, an incoming signal 115 to the low voltage circuit 102 is coupled to a driver transistor M1 at its drain. A source of M1 is coupled to a low power supply rail. A back gate of transistor M1 is coupled to the higher voltage power supply, $V_{HIGH}$ at pin 120.

A parasitic diode D1 tends to be present between the source and the back gate of M1. A parasitic diode D2 also tends to be present between the back gate and drain of M1. A gate of M1 is being driven by internal circuitry of the I/O cell. Although this circuit tends to be more robust, as previously mentioned, severe damage tends to occur if the system power supply is activated first. In some applications, a need for power supply sequencing tends to be undesirable.

It is desirable to provide over voltage protection as described in FIG. 2 and additional circuitry that provides independent sequencing of the power supplies.

Figure 3:
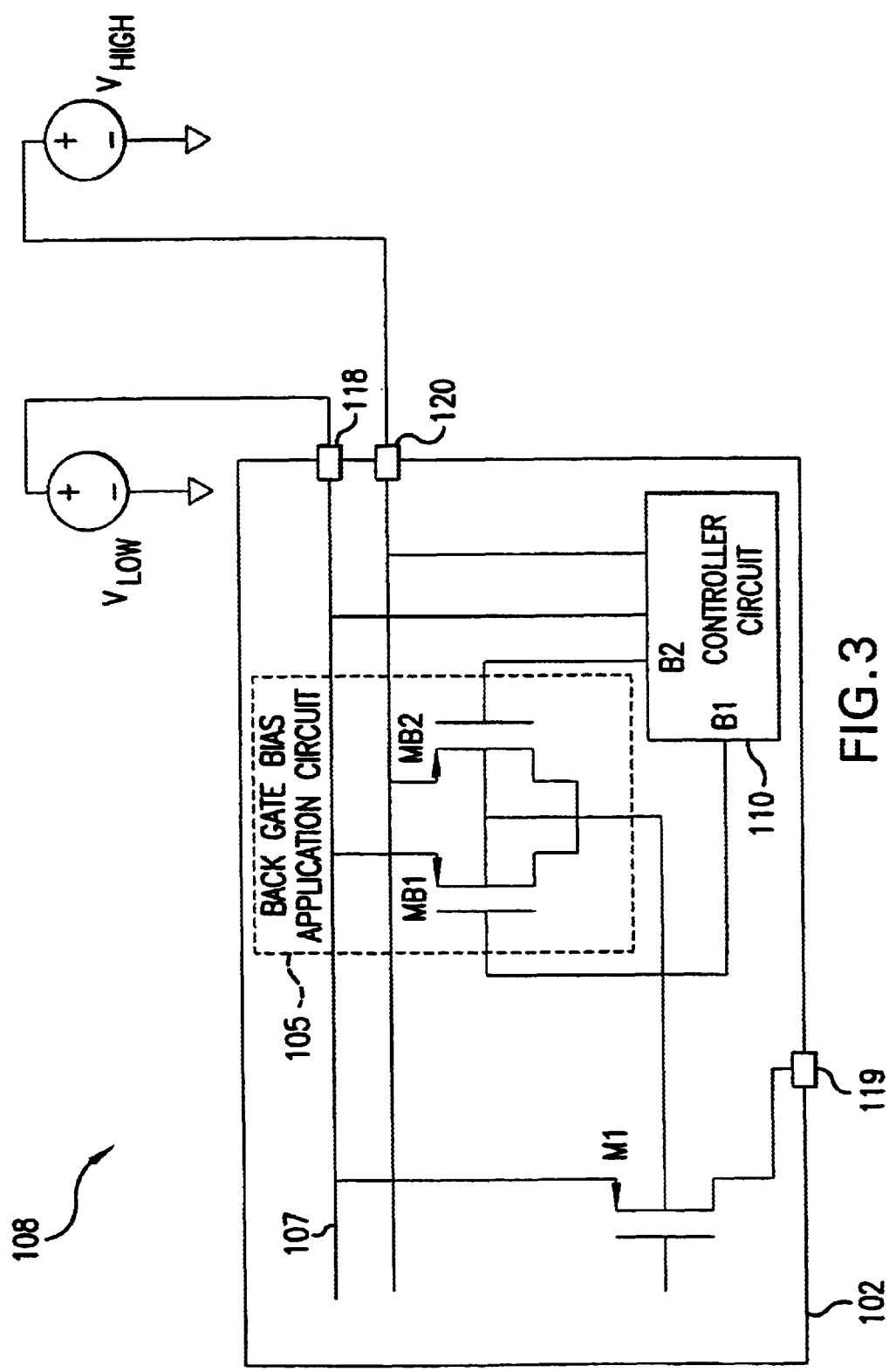
FIG. 3 is a schematic of a second embodiment of the invention that allows independent sequencing of the power supplies.

FIG. 3 is a schematic of an embodiment of the invention that tends to provide independent sequencing of the power supplies and parasitic current flow. Power supply status is evaluated by a controller circuit 110 to generate a set of control signals B1, B2 utilized by the I/O circuitry (122 of FIG. 2) to sequence the power supplies without damaging the IP core. The circuit of FIG. 2 is modified by the addition of two transistors that function as switches MB1, MB2 (shown collectively in FIG. 3 as back gate bias application circuit 105) and a controller circuit 110. Transistors MB1 and MB2 prevent the back gate of M1 from being connected to the supplier voltage system power supply before the system power supply is available at its full voltage. Transistors MB1 and MB2 are controlled via gate signals B1 and B2 that are supplied by controller circuit 110.

The drain of driver transistor M1 is coupled to an I/O 1signal 115 (of FIG. 2) at a pad 119. The source of M1 is coupled to the low voltage supply rail set at voltage $V_{LOW}$. The back gate of driver transistor M1 is coupled in common to the drains and back gates of transistors MB1 and MB2. The source of MB1 is coupled to the system power supply line set at a voltage value $V_{LOW}$ at 118. Transistor MB2 is coupled to a chip power supply set at a value of $V_{HIGH}$ at 120.

Controller circuit 110 provides gate signals B1, B2 to the gates of MB1 and MB2 respectively. The controller circuit is coupled to voltage supplies $V_{LOW}$ and $V_{HIGH}$. Gate signals B1 and B2 control transistors MB1 and MB2 to prevent system power from being coupled to the back gate of M1 when the chip power supply is present before the system power supply.

Figure 4:
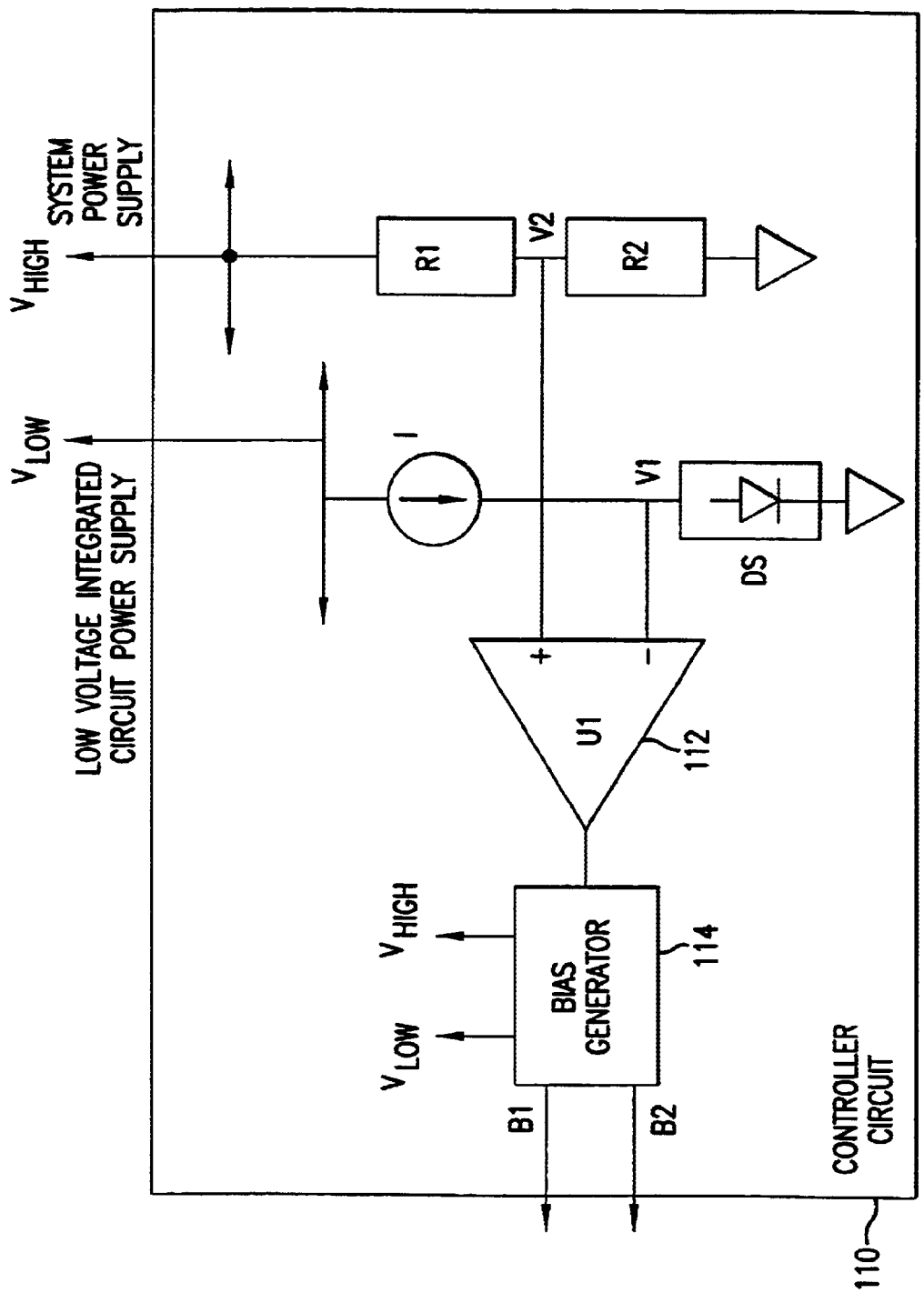
FIG. 4 is a schematic diagram of a control circuit that evaluates power supply status and generates a required set of control signals.

FIG. 4 is a schematic diagram of controller circuit 110 that evaluates power supply status and generates a required set of control signals utilized by the circuit of FIG. 3. The controller circuit 110 makes a decision based upon which power supply is activated before the other by using a comparator 112. Comparison is made based upon reference voltages derived from voltages present for the chip power supply and the system power supply.

From the power supplies, reference voltages V1 and V2 are created as inputs coupled to the comparator 112 (also designated as U1 in FIG. 4). The comparator output is fed to a bias generator 114 that generates the gate signals B1 and B2. The relationship between voltages B1 and B2 is such that they allow either MB1 or MB2 to turn on, but do not allow MB1 and MB2 to turn on simultaneously. Note that in an embodiment, MB1 and MB2 may be on simultaneously for a small period of time when the power supply values are rising faster than B1 and B2 can correct MB1 and MB2. In the exemplary embodiment, momentary overlap is minimal and is not as destructive as the case where the power sequencing circuit is absent. To drive the control signals B1 and B2, the comparator 112 takes a reading based upon the state of each power supply. Comparator inputs are voltages V1 and V2.

Voltage V1 is generated when the lower voltage chip power supply begins to ramp up in voltage value. When the chip power supply begins to supply voltage to the circuit, a current source I starts current conduction through a chain of diodes DS. The diode chain DS provides the voltage drop V1. Voltage V1 provides an indication of the chip power supply reaching a given level. Voltage V1 is coupled to a negative terminal of the comparator 112.

Voltage V2 is the output of the resistive divider comprising resistors R1 and R2. Voltage V2 is the reference voltage that sets a trip point which causes a comparator 112 output to change state. Resistor R1 has a first terminal that is coupled to the system's power supply line and a second terminal that is coupled to a first terminal of R2 and the positive input of the comparator 112. The second terminal of R2 is coupled to ground. The output of the comparator 112 is coupled to a bias generator circuit 114. The bias generator circuit 114 has inputs including the comparator input, $V_{HIGH}$ and $V_{LOW}$. Bias generator outputs are voltages B1 and B2.

Figure 5:
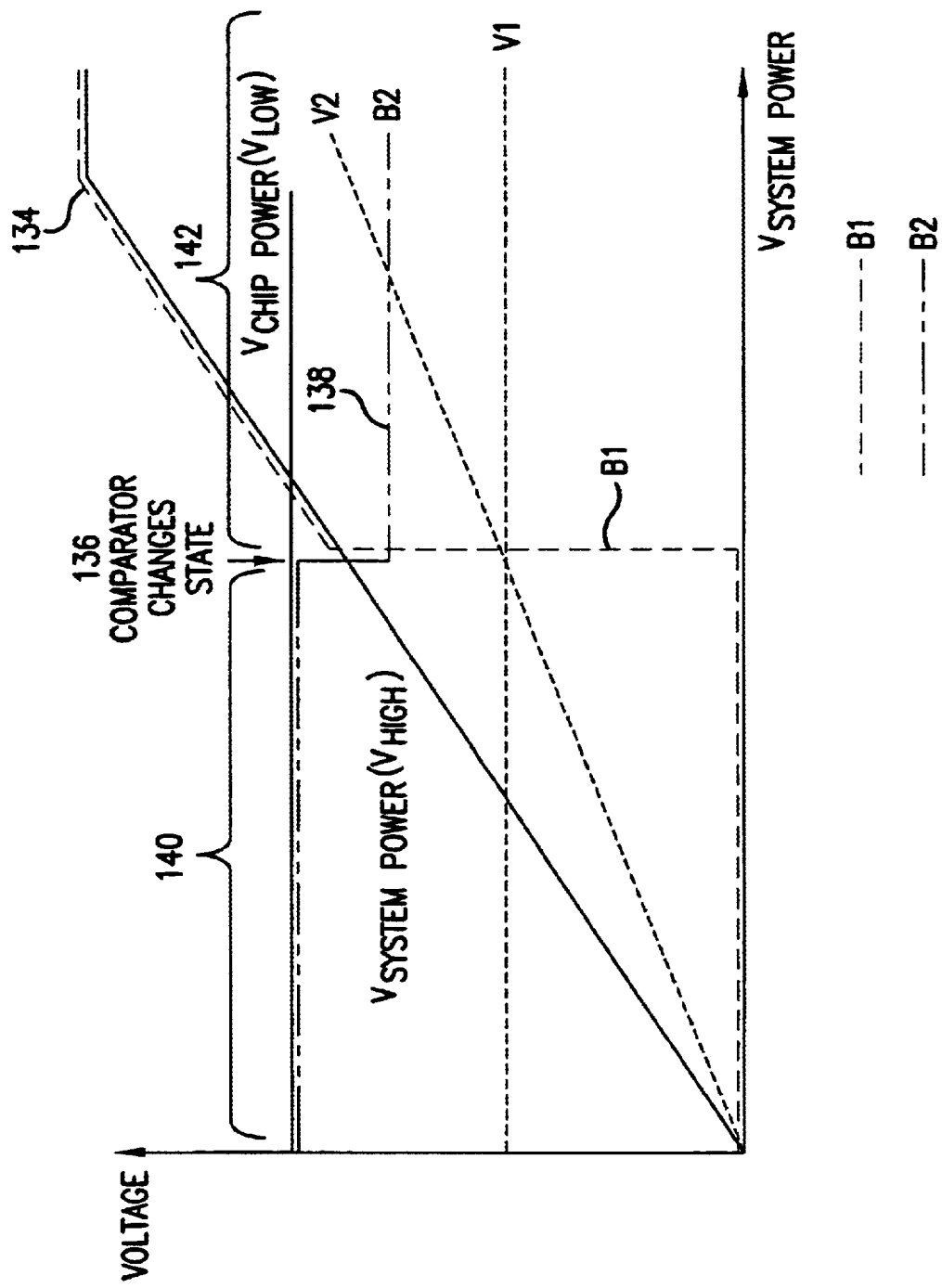
FIG. 5 is a graph of the relationship of the voltages used in the power sequencing circuit.

FIG. 5 is a graph of the relationship of the voltages used in the power sequencing circuit of FIG. 3. At turn on and prior to the comparator (112 of FIG. 4) changing state 140 $V_{LOW}$ is applied to the back gate of a driver transistor (M1 of FIG. 3) in the interfacial circuit of the low voltage circuit (102 of FIG. 3). During time interval 140 the voltage on the gate of MB2 of FIG. 3 is close to $V_{LOW}$, turning off MB2 and preventing the rising voltage of $V_{HIGH}$ from being applied to the back gate of M1 (of FIG. 3). Also during the time interval 140 the voltage B1 applied to the gate of MB1 of FIG. 3 is close to or equal to zero volts coupling $V_{LOW}$ to the back gate of M1 of FIG. 3.

When the comparator changes state 136, the levels of B1 and B2 change state. The comparator change of state is set so that it is somewhat lower than the chip power supply to avoid noise tending to trigger the transistor switches (MB1 and MB2 of FIG. 3).

During time interval 142 the levels of B1 and B2 (of FIG. 3) change state causing $V_{HIGH}$ to be applied to the back gate of a driver transistor (M1 of FIG. 3) in the interfacial circuit of the low voltage circuit (102 of FIG. 3). During time interval 140 the voltage on the gate of MB2 of FIG. 3 is reduced to a level below $V_{LOW}$ turning on MB2 and applying $V_{HIGH}$ to the back gate of M1 (of FIG. 3). Also during the time interval 142 the voltage B1 applied to the gate of MB1 of FIG. 3 is rising as the voltage of $V_{HIGH}$ rises causing transistor switch MB1 (of FIG. 3) to turn off decoupling $V_{LOW}$ from the back gate of M1 of FIG. 3. The voltage $V_{HIGH}$ on the back gate of M1 continues to rise as $V_{HIGH}$ ramps up to its final value.

Figure 6:
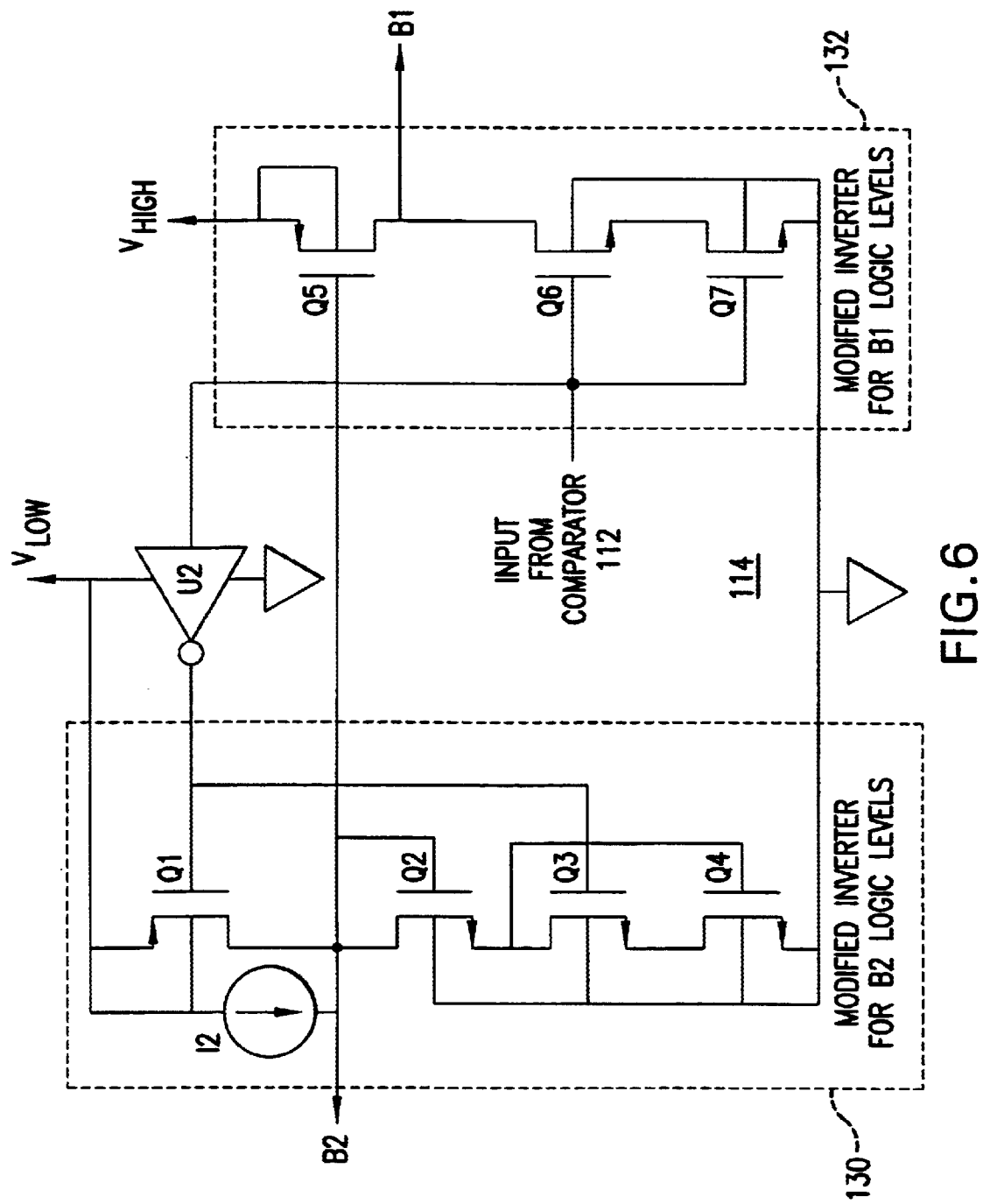
FIG. 6 is schematic diagram of an embodiment of a bias generator circuit.

FIG. 6 is a schematic diagram of an embodiment of a bias generator circuit 114. The bias generator circuit 114 includes three inverting circuits 130, 132, U2. The inverter circuits produce output levels B1 and B2 in response to the comparator 112 (of FIG. 4) output and the power supply voltages $V_{HIGH}$ and $V_{LOW}$ that tend to change on power up of a system. Outputs B1 and B2 are as shown in FIG. 5 and control the application of $V_{LOW}$ and $V_{HIGH}$ to a back gate of a driver transistor M1 (of FIG. 3) in an interfacial circuit.

Signals B1 and B2 do not function as conventional inverter signals that switch between power supply rails and ground. Inverter U2 is conventionally constructed as known by those skilled in the art.

A modified inverter for B2 logic levels 130 includes a PMOS transistor Q1 and an NMOS transistor Q3 to achieve an inverter function. The modified inverter 130 functions as a conventional inverter before the comparator changes state (140 of FIG. 5), B2 follows the level of $V_{LOW}$ as a high state. After the comparator changes state 142, B2 changes to a low state. However, this low state does not correspond to zero volts, but to an intermediate value less than $V_{LOW}$. Transistors Q2 and Q4 are configured as diode level shifters and prevent B2 from floating all the way to ground when the comparator changes state. A sufficient level is chosen for B2 that will not over stress the gate of the transistor it is driving (MB2 of FIG. 3) by applying an excessive gate to drain voltage. Conventionally constructed current source I2 is present in the circuit to provide bias for the transistors configured to function as diodes Q2, Q4.

A modified inverter for B1 logic levels 132 includes a PMOS transistor Q5 and two NMOS transistors Q6, Q7 to achieve an inverter function. Transistors Q6 and Q7 are required due to the high bias voltage $V_{HIGH}$ being present. Transistor Q6 provides a voltage drop to prevent transistor Q7 of the inverter from being over stressed.

In the bias generator circuit 114, the inverter U2 is coupled to the $V_{LOW}$ power supply. The inverter input terminal is coupled to the output terminal from the comparator (112 of FIG. 4). The inverter output terminal is coupled to a gate of Q1.

A modified inverter for B2 logic levels 130 includes a NMOS transistor Q1 and PMOS transistors Q2, Q3, and Q4. Transistor Q1 includes a source terminal coupled to $V_{LOW}$, a back gate terminal coupled to $V_{LOW}$, and a drain terminal coupled to output B2 and coupled to a drain terminal of Q2. A conventional current source I2 has an input terminal coupled to $V_{LOW}$, and an output terminal coupled to the drain of Q2.

Transistor Q2 includes a gate terminal coupled to B2, a back gate terminal coupled to a ground, and a source terminal coupled to a drain terminal of Q3. Transistor Q3 includes a gate terminal coupled to the gate terminal of Q1, a back gate terminal coupled to ground, and a source terminal coupled to a drain terminal of Q4. Transistor Q4 includes a gate terminal coupled to the drain terminal of Q3, a back gate terminal coupled to ground and a source terminal coupled to ground.

A modified inverter for B1 logic levels 132 includes a PMOS transistor Q5 and NMOS transistors Q6 and Q7. Transistor Q5 includes a source terminal coupled to $V_{HIGH}$, a gate terminal coupled to B2, a back gate terminal coupled to $V_{HIGH}$ and a drain coupled to terminal B1.

Transistor Q6 includes a drain terminal coupled to terminal B1, a gate terminal coupled to the input of inverter U2, a back gate terminal coupled to ground and a source terminal coupled to a drain of Q7. Transistor Q7 includes a gate terminal coupled to the input of inverter U2, a back gate terminal coupled to ground and a source terminal coupled to ground.

Figure 7:
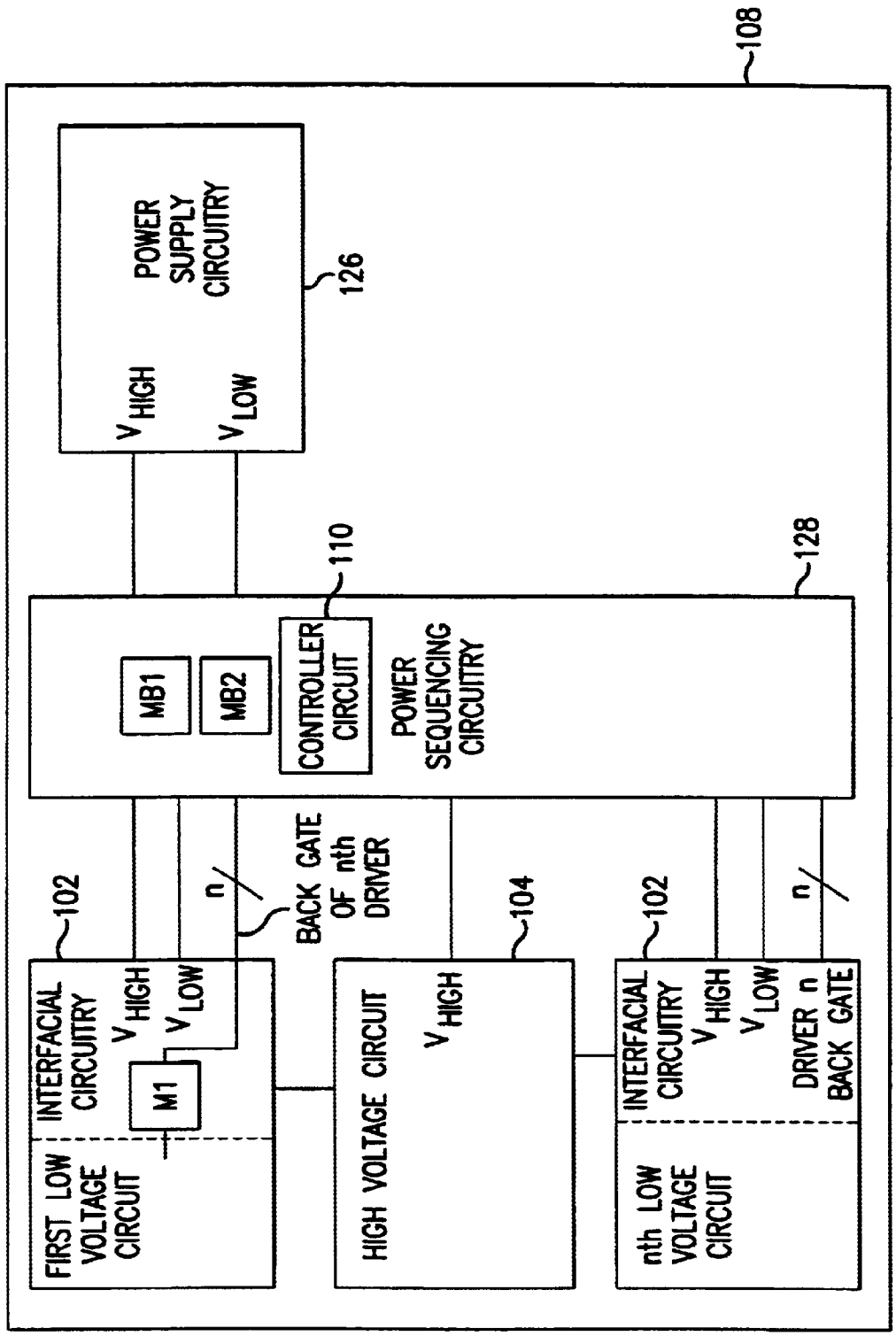
FIG. 7 is a block diagram of a system that allows interconnected circuits operating from differing power supplies to be protected from damage caused by variations in sequential power supply application at circuit power up.

FIG. 7 is a block diagram of a system that allows interconnected circuits operating from differing power supplies to be protected from damage caused by variations in sequential power supply application at circuit power up. The embodiment described is implemented as an integrated circuit. However, those skilled in the art will appreciate that the system described may be applied to other configurations of circuitry, such as printed wiring boards, hybrid circuits and the like.

An integrated circuit 108 utilizes a number of sub circuits, often referred to as IP cores ("cores") 102, 104 to implement a desired overall function. Each of the IP cores might implement an individual sub-function such as a memory, processor, modulator or the like. Examples of overall functions might include the implementation of a cable modem or G-Bit Ethernet device. IP cores often operate from differing voltages depending upon the technology used in designing the IP cores, or other considerations. The cores are coupled to each other to realize the overall function desired.

IP cores 102, 104 are often interconnected so that an I/O connection exists between a first IP core 102,and a second IP core 104. IP core 102 is biased by a voltage $V_{LOW}$, that is lower in value than the bias voltage applied to the second IP core, $V_{HIGH}$.

Lack of power sequencing at start up tends to damage an IP core 102 operating from the lower power supply voltage. By utilizing power sequencing circuitry 128 and a back gate connection to transistors such as PMOS transistor M1 disposed in the I/O circuitry of the lower voltage cores 102, damage to the circuitry tends to be reduced when improper sequencing of the power supplies 126 occurs.

In the embodiment shown, several low voltage circuits or "cores" 102 are disposed on an integrated circuit substrate 108. In addition one or more cores that operate at higher voltages 104 are present on the substrate and functionally interact with the low voltage circuits or "cores".

Interconnection between cores typically is accomplished through interfacial (or I/O) circuits. Interfacial circuits typically include transistors such as M1 that are disposed between the circuitry on the IP core and one of "n" incoming signal lines. A back gate connection is provided from the interfacial transistor to the power sequencing circuitry 128. In addition a connection from the power supply $V_{HIGH}$ is supplied to the circuit running off of the lower supply voltage $V_{LOW}$. The higher supply voltage is utilized to operate transistor M1 of the interfacial circuitry in a manner tending to reduce damage caused by variations in power sequencing.

Power supply voltages $V_{HIGH}$ and $V_{LOW}$ emanating from power supply circuitry 126 are also processed by the power sequencing circuitry 128. PMOS transistors MB1 and MB2 operating under the control of a controller circuit 110 control the application of $V_{HIGH}$ and $V_{LOW}$ to the interfacial circuits such that the circuitry is not damaged if the power supplies are sequenced randomly, or if one supply does not rise to its final value as quickly as expected.

The circuitry shown in the block diagrams may be equivalently shifted between the functional blocks described in the practical implementation of the invention. In particular the interfacial circuitry may be merged into the power sequencing circuitry block.

What is claimed is:

1. A circuit for applying power to mixed mode integrated circuits in a predefined sequence to a first circuit powered by a first voltage and a second circuit powered by a second voltage that is less than the first voltage and having the second voltage coupled to the first circuit comprising:

a modified I/O cell of the second circuit having a driver transistor including a back gate terminal, a gate terminal that is driven by the second circuit, a drain terminal that is coupled to a first circuit signal, a source terminal that is coupled to the second voltage;

a controller circuit coupled to the first voltage and the second voltage supplied as controller circuit inputs and having a plurality of controller circuit outputs; and a back gate bias application circuit having a plurality of inputs coupled to the plurality of controller circuit outputs, and an output coupled to the back gate of the driver transistor back gate terminal.

2. The circuit for applying power to integrated circuits of claim 1, wherein at least one of the integrated circuits is a mixed mode integrated circuit.

3. The circuit for applying power to integrated circuits of claim 1, wherein the source of at least one of the first voltage and the second voltage is external to the integrated circuit.

4. The circuit for applying power to integrated circuits of claim 1, wherein the source of at least one of the first voltage and the second voltage is located on the integrated circuit.

5. A circuit for applying power to integrated circuits in a predefined sequence to a first circuit powered by a first voltage and a second circuit powered by a second voltage that is less than the first voltage and having the second voltage coupled to the first circuit comprising:

a modified I/O cell of the second circuit having a driver transistor including a back gate connection coupled to the first voltage, a gate terminal that is driven by the second circuit, a drain terminal that is coupled to a first circuit signal, and a drain terminal that is coupled to the second voltage;

a controller circuit coupled to the first voltage and the second voltage supplied as controller circuit inputs and having a plurality of controller circuit outputs; and a back gate bias application circuit having a plurality of inputs coupled to the plurality of controller circuit outputs, and an output coupled to the back gate of the driver transistor back gate connection.

6. A circuit for applying power to mixed mode integrated circuits in a predefined sequence comprising:

a first circuit powered by a first voltage;

a second circuit powered by a second voltage that is less than the first voltage and having the second voltage coupled at to the first circuit;

an I/O cell disposed in the second circuit comprising a driver transistor having a back gate connection coupled to the first voltage, a gate terminal that is driven by the second circuit, a drain terminal that is coupled to the first circuit signal, and a source terminal that is coupled to the second voltage;

a controller circuit coupled to the first voltage and the second voltage supplied as controller circuit inputs and having a plurality of controller circuit outputs; and a back gate bias application circuit having a plurality of inputs coupled to the plurality of controller circuit outputs, and an output coupled to the back gate of the driver transistor back gate connection.

7. The circuit for applying power to a mixed mode integrated circuit of claim 6 wherein:

the first circuit is disposed on a first substrate; and the second circuit is disposed on a second substrate.

8. The circuit for applying power to an integrated circuit of claim 6 wherein:

the first circuit is disposed on a substrate; and the second circuit is disposed on the substrate.

9. The circuit for applying power to an integrated circuit of claim 6 wherein:

the first circuit is disposed on a substrate utilizing a 0.30 micron gate length CMOS process; and the second circuit is disposed on the substrate utilizing a 0.30 micron gate length CMOS process.

10. A circuit for applying power to integrated circuits in a predefined sequence comprising:

a first circuit powered by a first voltage;

a second circuit powered by a second voltage that is less than the first voltage and having the second voltage coupled to the first circuit;

a modified I/O cell of the second circuit having a driver transistor including a back gate, a gate terminal that is driven by the second circuit, a drain terminal that is coupled to a first circuit signal, a source terminal that is coupled to the second voltage, a first clamping transistor having a back gate and a drain coupled to the back gate of the driver transistor, a source coupled to the second voltage, and a first clamping transistor gate terminal, a second clamping transistor having a back gate and a drain coupled to the back gate of the driver transistor, a source coupled to the first voltage, and a second clamping transistor gate terminal;

a controller circuit coupled to the first voltage, the second voltage and ground;

a first divider network disposed between the first voltage and the ground and having a first divider tap point that produces a first divider reference voltage;

a second divider network disposed between the second voltage and the ground and having a second divider tap point that produces a second divider reference voltage;

a comparator having a first input coupled to the first divider tap point and having a second input coupled to the second divider tap point, and having a comparator output; and a bias generator having a bias generator input coupled to the comparator output and a first bias generator output coupled to the first clamping transistor gate, and a second bias generator output coupled to the second clamping transistor gate.

11. The circuit for applying power to integrated circuits of claim 10, wherein the bias generating circuit comprises:

a first inverter circuit, coupled to the second voltage and ground, and having an input;

a second inverter circuit, coupled to the first voltage and ground, and having an input coupled to the comparator output; and a third inverter circuit, coupled to the second voltage and ground, and having an input coupled to the comparator output and an output coupled to the input of the first inverter circuit, wherein the first inverter circuit and the second inverter circuit are coupled at the second bias generator output; and wherein the second inverter circuit has as an output the first bias generator output.

12. The circuit for applying power to integrated circuits of claim 11, wherein the first inverter circuit comprises:

a current source, having a current source input coupled to the second voltage and a current source output coupled to the second bias generator output;

aPMOS transistor, having a source terminal and a back gate terminal coupled to the second voltage, a gate terminal coupled to the output of the third inverter circuit, and a drain terminal coupled to the second bias generator output;

a first NMOS transistor, having a source terminal, a back gate terminal coupled to ground, and a gate terminal and drain terminal coupled to the second bias generator output;

a second NMOS transistor, having a source terminal, a back gate terminal coupled to ground, a gate terminal coupled to the PMOS transistor gate terminal, and a drain terminal coupled to the First NMOS transistor source terminal; and a third NMOS transistor, having a source terminal and back gate terminal coupled to ground, a gate terminal coupled to the second NMOS transistor drain terminal, and a drain terminal coupled to the second NMOS transistor source terminal.

13. The circuit for applying power to integrated circuits of claim 11, wherein the second inverter circuit comprises:

aPMOS transistor, having a source terminal and a back gate terminal coupled to the first voltage, a gate terminal, to the second bias generator output, and a drain terminal coupled to the first bias generator output;

a first NMOS transistor, having a source terminal, a back gate terminal coupled to ground, a gate terminal coupled to the input of the third inverter circuit, and a drain terminal coupled to the first bias generator output; and a second NMOS transistor, having a source terminal and a back gate terminal coupled to ground, a gate terminal coupled to the input of the third inverter circuit, and a drain terminal coupled to the first NMOS transistor source terminal.

14. The circuit for applying power to integrated circuits of claim 11, wherein the third inverter circuit comprises a conventional inverter.

15. A circuit for applying power to integrated circuits in a predefined sequence comprising:

a first circuit powered by a first voltage;

a second circuit powered by a second voltage that is less than the first voltage and having the second voltage coupled to the first circuit;

a modified I/O cell of the second circuit having a driver transistor including a back gate, a gate terminal that is driven by the second circuit, a drain terminal that is coupled to a first circuit signal, a source terminal that is coupled to the second voltage, a first clamping transistor having a back gate and a drain coupled to the back gate of the driver transistor, a source coupled to the second voltage, and a first clamping transistor gate terminal, a second clamping transistor having a back gate and a drain coupled to the back gate of the driver transistor, a source coupled to the first voltage, and a second clamping transistor gate terminal;

a controller circuit coupled to the first voltage, the second voltage and ground;

a resistive divider disposed between the first voltage and the ground and having a first tap point that produces a first reference voltage that is less than the first voltage;

a divider network coupled to the second voltage including a current source having a first terminal coupled to the second voltage and a second terminal outputting a current, a chain of diodes including a plurality of diodes having each diode of the plurality of diodes coupled such that a positive terminal of a first diode to a negative terminal of a next diode in the chain and having a first positive terminal of the chain coupled to the second terminal of the current source and a last negative terminal of the chain coupled to ground, a node connecting the current source and the chain of diodes forming a second tap point that produces a second reference voltage;

a comparator having a first input coupled to the first tap point and having a second input coupled to the second tap point, and having a comparator output; and a bias generator having a bias generator input coupled to the comparator output and a first bias generator output coupled to the first clamping transistor gate, and a second bias generator output coupled to the second clamping transistor gate.

16. A method of applying power to integrated circuits comprising:

creating a first threshold voltage based upon a first power supply state;

creating a second threshold voltage based upon a second power supply state;

comparing the first threshold voltage to the second threshold voltage;

generating a first bias signal based on the comparison of the first threshold voltage to the second threshold voltage; and generating a second bias signal based on the comparison of the first threshold voltage to the second threshold voltage.

* * * * *

UNITED STATES PATENT AND TRADEMARK OFFICE
CERTIFICATE OF CORRECTION

PATENT NO. : 6,671,816 B1
DATED : December 30, 2003
INVENTOR(S) : Agnes N. Woo

It is certified that error appears in the above-identified patent and that said Letters Patent is hereby corrected as shown below:

Column 1,
Line 20, please insert a comma after "voltages".
Line 21, please replace "circuit" with -- circuits --.
Line 47, please delete the comma after "includes".

Column 2,
Line 46, please insert a comma after "$V_{LOW}$".

Column 3,
Line 22, please insert a comma after the first occurrence of "circuitry".

Column 6,
Lines 14, 17, 21 and 33, please insert a comma after "140".
Lines 29 and 36, please insert a comma after "142".

Column 7,
Line 39, please insert a comma after "ground".

Column 8,
Line 10, please insert a comma after "addition".
Line 40, please delete "mixed mode".

Column 9,
Line 8, please replace "drain" with -- source --.
Line 18, please delete "mixed mode".
Line 23, please delete "at".
Line 38, please replace "a mixed mode" with -- an --.

Column 10,
Lines 44 and 66, please replace "aPMOS" with -- a PMOS --.

UNITED STATES PATENT AND TRADEMARK OFFICE
CERTIFICATE OF CORRECTION

PATENT NO. : 6,671,816 B1
DATED : December 30, 2003
INVENTOR(S) : Agnes N. Woo

It is certified that error appears in the above-identified patent and that said Letters Patent is hereby corrected as shown below:

Column 11,
Line 1, please replace "terminal, to" with -- terminal coupled to --.

Signed and Sealed this

Thirtieth Day of March, 2004

JON W. DUDAS
*Acting Director of the United States Patent and Trademark Office*